United States Patent [19]

Fukutani

[11] Patent Number: 5,011,901
[45] Date of Patent: Apr. 30, 1991

[54] POLYORGANOSILOXANE WITH CHLOROMETHYL GROUPS

[75] Inventor: Yoshimi Fukutani, Chiba, Japan

[73] Assignee: Dow Corning Toray Silicone, Tokyo, Japan

[21] Appl. No.: 434,202

[22] Filed: Nov. 13, 1989

Related U.S. Application Data

[63] Continuation-in-part of Ser. No. 355,511, May 23, 1989, abandoned.

[30] Foreign Application Priority Data

May 25, 1988 [JP] Japan .................................. 63-127284
Nov. 10, 1988 [JP] Japan .................................. 63-284650

[51] Int. Cl.$^5$ ........................................... C08G 77/24
[52] U.S. Cl. ........................................ 528/42; 528/36; 528/39; 556/455; 556/462; 556/488
[58] Field of Search ............................ 528/36, 39, 42; 556/455, 462, 488

[56] References Cited

FOREIGN PATENT DOCUMENTS 207041 12/1983 Japan .
 59347  4/1985 Japan .
212756 10/1985 Japan .
 20032  1/1986 Japan .

OTHER PUBLICATIONS

Denki Kenkyusho Kunkyu Jitsuyoka Hokoku, vol. 33, No. 9, p. 77 (1984).
Denshi Tsushin Gakkai Gijutsu Kenkyu Hokoku-sho, vol. 84, No. 291, p. 27 (1984).

Primary Examiner—Melvyn I. Marquis
Attorney, Agent, or Firm—Roger H. Borrousch

[57] ABSTRACT

Polyorganosiloxane which are useful as resist materials for use in microprocesses such as large scale integration device fabrication are those of the formula

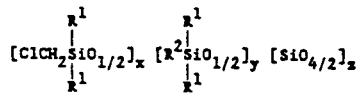

where $R^1$ is a monovalent hydrocarbon group having 1 to 6 carbon atoms; $R^2$ is a hydrogen atom or a monovalent hydrocarbon group having 1 to 6 carbon atoms; x and z are positive numbers; y is zero or a positive number; and x, y, and z have values such that their ratios are $0.3 \leq (x+y)/z \leq 4$; and zero $\leq y/x \leq 100$. The polyorganosiloxanes can be prepared by cohydrolysis or condensation reactions of hydrolyzable group-containing organosilanes or disiloxanes with tetrafunctional hydrolyzable silanes.

8 Claims, No Drawings

POLYORGANOSILOXANE WITH CHLOROMETHYL GROUPS

This application is a continuation-in-part of Ser. No. 07/355,511, filed May 23, 1989 and now abandoned.

BACKGROUND OF THE INVENTION

1. Technical Field

The present invention relates to a novel polyorganosiloxane and to a method for its preparation. More particularly, the present invention relates both to a novel polyorganosiloxane which is sensitive and reactive to high-energy radiation such as ultraviolet radiation, electron beams, X-rays, etc and also to a method for the preparation of said novel polyorganosiloxane.

2. Prior Art

Organic groups sensitive and reactive to high-energy radiation comprise those which generate a chain reaction, such as the epoxy group and the double bond, and those which generate a consecutive reaction, such as haloalkyl groups.

Within the realm of organopolysiloxanes which contain high energy radiation-sensitive organic groups which generate a consecutive reaction, one has recourse to di(alpha-chloromethylphenyl)polysiloxanes as described in Denki Tsushin Kenkyusho Kenkyu Jitsuyoka Hokoku, Volume 33, Number 9, page 77 (1984), alpha-chloromethylphenylpolysilsesquioxanes as described in Denshi Tsushin Gakkai Gijutsu Kenkyu Hokoku-sho, Volume 84, Number 291, page 27 (1984), and Japanese Patent Application Laid Open [Kokai or Unexamined] No. 60-59347 (59,347/85), published Apr. 4, 1985, and assigned to Nippon Telegraph and Telephone, and alpha-chloromethylphenylalkylpolysilsesquioxanes described by Nippon Telegraph and Telephone in Japanese Patent Application Laid Open No. 61-20032 (20,032/86), published Jan. 28, 1986. Other halogenated phenyl polysiloxanes are described by Yasuo Iida in Japanese Laid Open No. 58-207,041 (207,041), published Dec. 2, 1983, and by Masao Morita et al in Japanese Laid Open No. 60-212,756 (212,756/85), published Oct. 25, 1985. Naohiro Muramoto and Katsutoshi Mine in copending application Ser. No. 07/268,109, filed Nov. 7, 1988, assigned to the same assignee as the present invention and entitled "Pattern-Forming Material And Pattern Formation Method" describe polyorganosiloxanes which contain $SiO_2$ and chloromethyldimethylsiloxy units.

PROBLEMS TO BE SOLVED BY THE INVENTION

However, chain reaction-type organic compounds are generally highly sensitive, and as a result polymerization can continue even after exposure to high-energy radiation. As a consequence of this, when such compounds are used in resist materials, the resolution of the resist is reduced.

With regard to consecutive reaction-type alpha-chloromethylphenyl group-containing organopolysiloxanes, the synthesis of these polymers is tedious, and it is difficult to control the titer or quantity of the high energy radiation-sensitive organic groups. In addition, the molecular weight and softening point cannot be controlled or adjusted.

Furthermore, there has as yet been no description of polyorganosiloxane having within a single molecule both tetrafunctional siloxane units and monofunctional triorganosiloxane units which contains the silicon-bonded chloromethyl group. Nor is a method known for the preparation of such a polyorganosiloxane.

SUMMARY OF THE INVENTION

An object of the present invention is a novel organopolysiloxane having within each molecule the tetrafunctional siloxane unit and the monofunctional triorganosiloxane unit containing the silicon-bonded chloromethyl group, and an object is also a method for the preparation of said organopolysiloxane which provides for an easy, straightforward synthesis while allowing the simple regulation and adjustment of the molecular weight, softening point, and titer of high-energy radiation-sensitive organic groups.

This invention relates to a polyorganosiloxane with a molecular weight of 500 to 500,000 which has the following general formula

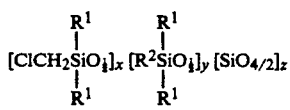

in which $R^1$ is a monovalent hydrocarbon group having 1 to 6 carbon atoms; $R^2$ is a hydrogen atom or a monovalent hydrocarbon group having 1 to 6 carbon atoms; x and z are positive numbers; y is zero or a positive number; and x, y, and z have values such that their ratios are $0.3 \leq (x+y)/z \leq 4$; and $zero \leq y/x \leq 100$.

This invention also relates to a method for the preparation of polyorganosiloxane with a molecular weight of 500 to 500,000 which has the following general formula

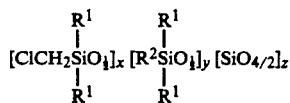

in which $R^1$ is a monovalent hydrocarbon group having 1 to 6 carbon atoms; $R^2$ is a hydrogen atom or a monovalent hydrocarbon group having 1 to 6 carbon atoms; x and z are positive numbers; y is zero or a positive number; and x, y, and z have values such that their ratios are $0.3 \leq (x+y)/z \leq 4$; and $zero \leq y/x \leq 100$, said method comprising cohydrolysis or condensation reactions of (A) hydrolyzable group-containing organosilane as represented by the following general formula

in which $R^1$ is defined as above, and M is a hydrolyzable group or (A') disiloxane as represented by the following general formula

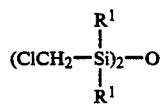

in which R¹ is defined as above, (B) hydrolyzable group-containing organosilane as represented by the following general formula

in which R¹, R², and M are defined as above or (B') disiloxane as represented by the following general formula

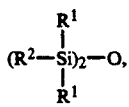

and (C) hydrolyzable silane as represented by the following general formula

SiM₄

M in the formula is defined as above.

DETAILED DESCRIPTION OF THE INVENTION

To explain the preceding in greater detail, the group R¹ in the above formula is a monovalent hydrocarbon group having 1 to 6 carbon atoms. Examples of R¹ are alkyl groups such as methyl, ethyl, n-propyl, isopropyl, n-butyl, and isobutyl; alkenyl groups such as vinyl and allyl; and the phenyl group. Within the individual molecule, R¹ may comprise only a single species, or may comprise a combination of two or more different species. Furthermore, the group R² is the hydrogen atom or a monovalent hydrocarbon group having 1 to 6 carbon atoms, and the latter is exemplified as for R¹.

In addition, x and z are positive numbers, y is zero or a positive number, and it is essential that the ratio of x, y, and z have values such that $0.3 \leq (x+y)/z \leq 4$ and that $zero \leq y/x \leq 100$. When x, y, and z fall outside these ranges, synthesis becomes difficult and the sensitivity to high-energy radiation drops off. Furthermore, when x, y, and z satisfy $0.3 \leq (x+y)/z \leq 1.0$, the polyorganosiloxane of the present invention will be a solid at room temperature.

The molecular weight is to be 500 to 500,000 because synthesis becomes problematic outside this range.

Any of the following may be bonded to the tetrafunctional siloxane unit with the formula $SiO_{4/2}$ in the polyorganosiloxane of the present invention: other tetrafunctional siloxane units with the formula $SiO_{4/2}$, monofunctional siloxane units with the general formula

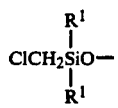

in which R¹ is defined as above, and monofunctional siloxane units with the general formula

in which R¹ and R² are defined as above. In addition, polyorganosiloxane of the present invention may also contain minor quantities of hydroxyl groups, alkoxy groups, halogen atoms, etc., as residues from the synthesis process.

The method for the preparation of the polyorganosiloxane of the present invention comprises the cohydrolysis/condensation reactions of (A) hydrolyzable group-containing organosilane as represented by the following general formula

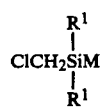

in which R¹ is defined as above, and M is a hydrolyzable group or (A') disiloxane as represented by the following general formula

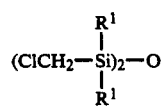

in which R¹ is defined as above, (B) hydrolyzable group-containing organosilane as represented by the following general formula

in which R¹, R², and M are defined as above or (B') disiloxane as represented by the following general formula

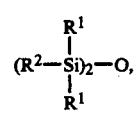

and (C) hydrolyzable silane as represented by the following general formula

SiM₄ in which M in the formula is defined as above.

Preparation of the polyorganosiloxane of the present invention may be accomplished by the cohydrolysis and condensation reactions of x moles hydrolyzable group-containing organosilane with the general formula

in which R¹ is defined as above, and M is a hydrolyzable group, y moles hydrolyzable group-containing organosilane with the general formula

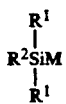

in which R¹, R², and M are defined as above, and z moles hydrolyzable silane with the general formula $SiM_4$ in which M is defined as above, wherein x, y, and z are defined as above.

Examples of the hydrolyzable group M in the above formulas are halogen atoms such as the chlorine atom and bromine atom; alkoxy groups such as methoxy, ethoxy, isopropoxy, and methoxyethoxy; and acyloxy groups such as acetoxy.

The hydrolyzable group-containing organosilane (A) with the general formula

in which R¹ is defined as above, and M is a hydrolyzable group can be easily synthesized, for example, by the photochlorination of trimethylchlorosilane.

Furthermore, the disiloxane (A') as represented by the following general formula

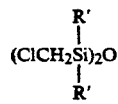

in which R' is defined as above, is readily synthesized by hydrolysis of hydrolyzable group-containing organosilane (A).

Solvents may be used during cohydrolysis/condensation reactions, and examples are aromatic hydrocarbon solvents such as benzene, toluene, and xylene; alcohol solvents such as methanol and ethanol; ketone solvents such as acetone; and chlorinated hydrocarbon solvents. Furthermore, an acid catalyst may be used to promote the hydrolysis and condensation reactions, and examples are hydrochloric acid, sulfuric acid, phosphoric acid, nitric acid, and acetic acid.

Merely by varying the molar ratio among the chloromethyl-containing monofunctional siloxane unit, the monofunctional siloxane unit not containing chloromethyl, and the tetrafunctional siloxane unit, it is possible freely to adjust the molecular weight, softening point, and sensitivity to high-energy radiation of polyorganosiloxane of the present invention. Also, because the polyorganosiloxane of the present invention cures by the development of a consecutive reaction upon exposure to high-energy radiation, one can contemplate practical application, inter alia, in resist materials for use in microprocesses in large scale integration device fabrication.

The following examples are presented for experimental purposes and should not be construed as limiting the invention which is properly delineated in the claims.

EXAMPLE 1

The following ingredients were charged into a four-neck flask equipped with a stirrer, reflux condenser, addition funnel, and thermometer: 11.6 g (0.05 mol) 1,3-bis(alphachloromethyl)-1,1,3,3-tetramethyldisiloxane, 32.5 g (0.20 mol) hexamethyldisiloxane, 60 g water, 40 g concentrated hydrochloric acid, 20 g ethanol, and 30 g toluene. While stirring and heating to 70° C., 208.3 g (1.00 mol) tetraethoxysilane was dripped in over 2 hours. Heating under reflux was continued for 1 hour after the completion of the addition of the tetraethoxysilane. 100 g water was then added, and the polymer layer (lower layer) was separated off. The upper layer was extracted by the addition of 100 g water and 100 g toluene, and the aqueous layer was discarded. The toluene and polymer layers were combined, this was washed with water by the addition of 150 g toluene and 100 g water, and the aqueous layer was again discarded. The water was then removed by heating at the azeotrope. In order to cap residual silanol, 40 g hexamethyldisilazane was added with heating under reflux for 6 hours. Filtration and removal of the solvent afforded 106 g of a white solid without a softening point. The results of analysis described a polyorganosiloxane which was this white solid at room temperature having the properties reported below. The polyorganosiloxane was composed of the siloxane units as shown in the following formula

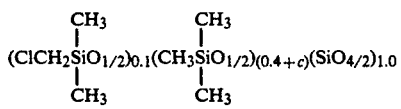

where c is value for the amount of trimethylsiloxy unit introduced by the hexamethyldisilazane capping step.

¹HNMR delta (ppm): 0.3(5.8H,br,CH₃Si), 1.3(0.5H,br, CH₃CH₂OSi), 2.7(0.2H,br,ClCH₂Si), 3.3(0.3H,br,CH₃C̄H₂OSi).

²⁹SiNMR delta (ppm): 13(0.57Si,br,(CH₃)₃SiO₁), 7(0.11Si, br,ClCH₂(CH₃)₂SiO₁), −100(0.16Si, br,ROSiO₃/₂), −110(0.84Si,br,SiO₄/₂).

GPC (gel permeation chromatography): $M_w$(weight-average molecular weight)=1.6×10⁴; $M_n$(number-average molecular weight)=4.7×10³.

EXAMPLE 2

The following ingredients were charged into a four-neck flask equipped with a stirrer, reflux condenser, addition funnel, and thermometer: 23.1 g (0.10 mol) 1,3-bis(alphachloromethyl)-1,1,3,3-tetramethyldisiloxane, 28.0 g (0.15 mol) 1,3-divinyl-1,1,3,3-tetramethyldisiloxane, 60 g water, 40 g concentrated hydrochloric acid, 20 g ethanol, and 30 g toluene. While stirring and heating at 70° C., 208.3 g (1.00 mol) tetraethoxysilane was dripped in over 2 hours. Heating under reflux was then continued for an additional 1 hour. Extraction of the polymer and post-treatment with hexamethyldisilazane according to the procedure in Example 1 afforded 107 g of a white solid without a softening point. The results of analysis described a polyorganosiloxane which was a white solid at room temperature having the properties reported below. The polyorganosiloxane was composed of siloxane units as shown in the following formula

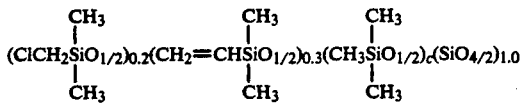

where c is as defined in Example 1.

$^1$HNMR delta (ppm): 0.3 (4.2H, br, CH$_3$Si), 1.3 (0.4H, br, CH$_3$CH$_2$OSi), 2.7 (0.4H, br, ClCH$_2$Si), 3.3 (0.3H, br, CH$_3$C$\overline{\text{H}}_2$OSi), 6.0 (0.9H, br, CH$_2$=CH—Si).

$^{29}$Si$\overline{\text{N}}$MR delta (ppm): 13 (0.16Si, br, (CH$_3$)$_3$SiO$_\frac{1}{2}$), 7 (0.18Si, br, ClCH$_2$(CH$_3$)$_2$SiO$_\frac{1}{2}$), 0 (0.28Si, br, CH$_2$=CH—(CH$_3$)$_2$SiO$_\frac{1}{2}$) −100 (0.13Si, br, ROSiO$_{3/2}$), −110 (0.87Si, br, SiO$_{4/2}$).

GPC: $M_w$=1.4×10$^4$; $M_n$=4.3×10$^3$.

EXAMPLE 3

The following ingredients were charged into a four-neck flask equipped with a stirrer, reflux condenser, addition funnel, and thermometer: 100.2 g (0.70 mol) alpha-chloromethyldimethylchlorosilane, 208.3 g (1.00 mol) tetraethoxysilane, and 100 g toluene. While stirring and heating at 70° C., a mixture of 60 g water, 40 g concentrated hydrochloric acid, and 20 g ethanol was dripped in over 2 hours. Heating under reflux was continued for an additional 4 hours after the completion of addition. 150 g water was added, and the polymer layer (lower layer) was separated off. This polymer layer was diluted with 250 g toluene, and the ethanol and water were removed azeotropically. 40 g hexamethyldisilazane was then added, and heating under reflux was carried out for 6 hours. Filtration and concentration of the filtrate afforded 115 g of a white solid with a softening point of approximately 110° C. The results of analysis described a polyorganosiloxane which was a white solid at room temperature having the properties reported below. The polyorganosiloxane was composed of siloxane units as shown in the following formula

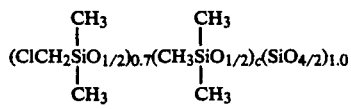

where c is as defined in Example 1.

$^1$HNMR delta (ppm): 0.3 (5.4H, br, CH$_3$Si), 1.3 (0.5H, br, CH$_3$CH$_2$OSi), 2.7 (1.4H, br, ClCH$_2$Si), 3.3 (0.3H, br, CH$_3$C$\overline{\text{H}}_2$OSi).

$^{29}$Si$\overline{\text{N}}$MR delta (ppm): 13 (0.15Si, br, (CH$_3$)$_3$SiO$_\frac{1}{2}$), 7 (0.65Si, br, ClCH$_2$(CH$_3$)$_2$SiO$_\frac{1}{2}$), −100 (0.15Si, br, ROSiO$_{3/2}$), −110 (0.85Si, br, SiO$_{4/2}$).

GPC: $M_w$=2.7×10$^3$; $M_n$=1.9×10$^3$.

EXAMPLE 4

The following ingredients were charged into a four-neck flask equipped with a stirrer, reflux condenser, addition funnel, and thermometer: 35.8 g (0.25 mol) alpha-chloromethyldi-methylchlorosilane, 27.2 g (0.25 mol) trimethylchlorosilane, 208.3 g (1.00 mol) tetraethoxysilane, and 100 g toluene. While stirring and heating to 70° C., a mixture of 60 g water, 40 g concentrated hydrochloric acid, and 20 g ethanol was dripped in over 2 hours. Heating under reflux was continued for an additional 4 hours after the completion of addition. 150 g water was then added, and the polymer layer (lower layer) was separated off. This polymer layer was diluted with 250 g toluene, and the ethanol and water were removed azeotropically. 40 g hexamethyldisilazane was then added, followed by heating under reflux for 6 hours. Filtration and concentration of the filtrate then afforded 108 g of a white solid without a softening point. The results of analysis described a polyorganosiloxane which was a white solid at room temperature having the properties reported below. The polyorganosiloxane was composed of siloxane units as shown in the following formula

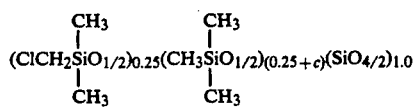

where c is as defined in Example 1.

$^1$HNMR delta (ppm): 0.3 (4.8H, br, CH$_3$Si), 1.3 (0.5H, br, CH$_3$CH$_2$OSi), 2.7 (0.5H, br, ClCH$_2$Si), 3.3 (0.3H, br, CH$_3$C$\overline{\text{H}}_2$OSi).

$^{29}$Si$\overline{\text{N}}$MR delta (ppm): 13 (0.38Si, br, (CH$_3$)$_3$SiO$_\frac{1}{2}$), 7 (0.22Si, br, ClCH$_2$(CH$_3$)$_2$SiO$_\frac{1}{2}$), −100 (0.16Si, br, ROSiO$_{3/2}$), −110 (0.84Si, br, SiO$_{4/2}$).

GPC: $M_w$=2.4×10$^4$; $M_n$=5.4×10$^3$.

EXAMPLE 5

The following ingredients were charged into a four-neck flask equipped with a stirrer, reflux condenser, addition funnel, and thermometer: 46.3 g (0.2 mol) 1,3-bis(alphachloromethyl)-1,1,3,3-tetramethyldisiloxane, 113.7 g (0.7 mol) hexamethyldisiloxane, 60 g water, 40 g concentrated hydrochloric acid, and 20 g ethanol. While stirring and heating at 70° C., 208.3 g (1.00 mol) tetraethoxysilane was dripped in over 2 hours. Heating under reflux was then continued for an additional 1 hour. 150 g water was added to the obtained polymer, and the polymer layer was separated off. The obtained polymer layer was diluted with 250 g toluene, and the ethanol and water were removed azeotropically. 10 mg potassium hydroxide was then added, followed by heating under reflux for 3 hours in order to conduct a dehydration condensation of residual silanol. Neutralization with trimethylchlorosilane, filtration, and concentration of the filtrate afforded 210 g of a colorless liquid with a viscosity of approximately 200 cp. The results of analysis described a polyorganosiloxane which was colorless liquid at room temperature having the properties reported below. The polyorganosiloxane was composed of siloxane units as shown in the following formula

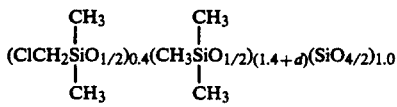

where d is a value for the amount of trimethylsiloxy units introduced by the trimethylchlorosilane neutralization step.

$^1$HNMR delta (ppm): 0.3 (14.6H, br, CH$_3$Si), 1.3 (0.2H, br, CH$_3$CH$_2$OSi), 2.7 (0.8H, br, ClCH$_2$Si), 3.3 (0.1H, br, CH$_3$C$\overline{\text{H}}_2$OSi).

$^{29}$SiNMR delta (ppm): 13 (1.36Si, br, (CH$_3$)$_3$SiO$_{\frac{1}{2}}$), 7 (0.40Si, br, ClCH$_2$(CH$_3$)$_2$SiO$_{\frac{1}{2}}$), −100 (0.08Si, br, ROSiO$_{3/2}$), −110 (0.92Si, br, SiO$_{4/2}$).

GPC: $M_w = 0.2 \times 10^3$; $M_n = 1.1 \times 10^3$.

EXAMPLE 6

The polyorganosiloxanes obtained in Example 1 through Example 4 were each dissolved in n-heptane to prepare 10 weight % solutions. The solutions were spin-coated on silicon wafers and dried to give polymer films with thicknesses of 0.5 micrometers. Curing occurred upon exposure to an electron beam (100 microC/cm$^2$, acceleration voltage=25 kV), and redissolution in ethanol was then no longer possible.

EXAMPLE 7

The polyorganosiloxanes obtained in Example 1 through Example 4 were each spin-coated and formed into polymer films by the procedure of Example 6. Curing occurred upon exposure to X-rays (13.3 angstroms, 500 mJ/cm$^2$), and redissolution in ethanol was then no longer possible.

EFFECTS OF THE INVENTION

The present invention introduces a novel polyorganosiloxane whose synthesis is easy and whose molecular weight, titer of organic groups sensitive to high-energy radiation, and softening point can be easily adjusted or regulated. In addition, the present invention's method for the synthesis of the aforesaid polyorganosiloxane is characterized by ease of synthesis and a simple and straightforward ability to regulate and adjust the molecular weight, titer of organic groups sensitive to high-energy radiation, and softening point.

That which is claimed is:

1. Polyorganosiloxane with a molecular weight of 500 to 500,000 which has the following general formula

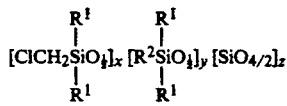

in which R$^1$ is a monovalent hydrocarbon group having 1 to 6 carbon atoms; R$^2$ is a hydrogen atom or a monovalent hydrocarbon group having 1 to 6 carbon atoms; x and z are positive numbers; y is zero or a positive number; and x, y, and z have values such that their ratios are $0.3 \leq (x+y)/z \leq 4$; and zero $\leq y/x \leq 100$.

2. The polyorganosiloxane according to claim 1 which is solid at room temperature and for which $0.3 \leq (x+y)/z \leq 1.0$.

3. The polyorganosiloxane according to claim 1 which is made from reaction of 1,3-bis(alpha-chloromethyl)-1,1,3,3-tetramethyldisiloxane, hexamethyldisiloxane, and tetraethoxysilane, and which is a solid at room temperature having the values for $^1$HNMR delta (ppm) of 0.3 (5.8H, br, CH$_3$Si), 1.3 (0.5H, br, CH$_3$CH$_2$OSi), 2.7 (0.2H, br, ClCH$_2$Si), 3.3 (0.3H, br, $\overline{\text{CH}}_3$CH$_2$OSi); the values for $^{29}$SiNMR delta (ppm) of 13 $\overline{(0.57\text{Si}}$, br, (CH$_3$)$_3$SiO$_{\frac{1}{2}}$), 7 (0.11Si, br, ClCH$_2$(CH$_3$)$_2$SiO$_{\frac{1}{2}}$), −100 (0.16Si, ROSiO$_{3/2}$), −110 (0.84Si, br, SiO$_{4/2}$); an $M_w$ of $1.6 \times 10^4$; and an $M_n$ of $4.7 \times 10^3$.

4. The polyorganosiloxane according to claim 1 which is made from reaction of 1,3-bis(alpha-chloromethyl)-1,1,3,3-tetramethyldisiloxane, 1,3-divinyl-1,1,3,3-tetramethyldisiloxane, and tetraethoxysilane, and which is a solid at room temperature having the values for $^1$HNMR delta (ppm) of 0.3 (4.2H, br, CH$_3$Si), 1.3 (0.4H, br, CH$_3$CH$_2$OSi), 2.7 (0.4H, br, ClCH$_2$Si), 3.3 (0.3H, br, CH$_3$$\overline{\text{CH}}_2$OSi), 6.0 (0.9H, br, CH$_2$=CH—Si); the values for $^{29}$SiNMR delta (ppm) of 13 (0.16Si, br, (CH$_3$)$_3$SiO$_{\frac{1}{2}}$), 7 (0.18Si, br, ClCH$_2$(CH$_3$)$_2$SiO$_{\frac{1}{2}}$), 0 (0.28Si, br, CH$_2$=CH—(CH$_3$)$_2$SiO$_{\frac{1}{2}}$), −100 (0.13Si, br, ROSiO$_{3/2}$), −110 (0.87 Si, br, SiO$_{4/2}$); an $M_w$ of $1.4 \times 10^4$; and an $M_n$ of $4.3 \times 10^3$.

5. The polyoganosiloxane according to claim 1 which is made from reaction of alpha-chloromethyldimethylchlorosilane and tetraethoxysilane, and which is a solid at room temperature having the values for $^1$HNMR delta (ppm) of 0.3 (5.4H, br, CH$_3$Si), 1.3 (0.5H, br, CH$_3$CH$_2$OSi), 2.7 (1.4H, br, ClCH$_2$Si), 3.3 (0.3H, br, $\overline{\text{CH}}_3$CH$_2$OSi); the values for $^{29}$SiNMR delta (ppm) of 13 $\overline{(0.15\text{Si}}$, br, (CH$_3$)$_3$SiO$_{\frac{1}{2}}$), 7 (0.65Si, br, ClCH$_2$(CH$_3$)$_2$SiO$_{\frac{1}{2}}$), −100 (0.15Si, br, ROSiO$_{3/2}$), −110 (0.85Si, br, SiO$_{4/2}$); an $M_w$ of $2.7 \times 10^3$; and an $M_n$ of $1.9 \times 10^3$.

6. The polyorganosiloxane according to claim 1 which is made from reaction of alpha-chloromethyldimethylchlorosilane, trimethylchlorosilane, and tetraethoxysilane, and which is a solid at room temperature having the values for $^1$HNMR delta (ppm) of 0.3 (4.8H, br, CH$_3$Si), 1.3 (0.5H, br, CH$_3$CH$_2$OSi), 2.7 (0.5H, br, ClCH$_2$Si), 3.3 (0.3H, br, C$\overline{\text{H}}_3$CH$_2$OSi); the value for $^{29}$SiNMR delta (ppm) of 13 (0.38Si, br, (CH$_3$)$_3$SiO$_{\frac{1}{2}}$), 7 (0.22Si, br, ClCH$_2$(CH$_3$)$_2$SiO$_{\frac{1}{2}}$), −100 (0.16Si, br, ROSiO$_{3/2}$), −110 (0.84Si, br, SiO$_{4/2}$); an $M_w$ of $2.4 \times 10^4$; and an $M_n$ of $5.4 \times 10^3$.

7. The polyorganosiloxane according to claim 1 which is made from reaction of 1,3-bis(alpha-chloromethyl)-1,1,3,3-tetramethyldisiloxane, hexamethyldisloxane, and tetraethoxysilane, and which is a liquid at room temperature having the values for $^1$HNMR delta (ppm) of 0.3 (14.6H, br, CH$_3$Si), 1.3 (0.2H, br, CH$_3$CH$_2$OSi), 2.7 (0.8H, br, ClCH$_2$Si), 3.3 (0.1H, br, CH$_3$$\overline{\text{CH}}_2$OSi); the values for $^{29}$SiNMR delta (ppm): 13 $\overline{(1.36\text{Si}}$, br, (CH$_3$)$_3$SiO$_{\frac{1}{2}}$), 7 (0.40Si, br, ClCH$_2$(CH$_3$)$_2$SiO$_{\frac{1}{2}}$), −100 (0.08Si, br, ROSiO$_{3/2}$), −110 (0.92Si, br, SiO$_{4/2}$); an $M_w$ of $1.2 \times 10^3$; and an $M_n$ of $1.1 \times 10^3$.

8. A method for the preparation of polyorganosiloxane with a molecular weight of 500 to 500,000 which has the following general formula

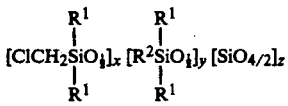

in which R$^1$ is a monovalent hydrocarbon group having 1 to 6 carbon atoms; R$^2$ is a hydrogen atom or a monovalent hydrocarbon group having 1 to 6 carbon atoms; x and z are positive numbers; y is zero or a positive number; and x, y, and z have values such that their ratios are $0.3 \leq (x+y)/z \leq 4$; and zero $\leq y/x \leq 100$, said method comprising cohydrolysis or condensation reactions of (A) hydrolyzable group-containing organosilane as represented by the following general formula

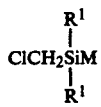

in which R¹ as defined as above, and M is a hydrolyzable group or (A') disiloxane as represented by the following general formula $$(ClCH_2-\underset{R^1}{\overset{R^1}{\underset{|}{\overset{|}{Si}}}})_2-O$$

in which R¹ is defined as above, (B) hydrolyzable group-containing organosilane as represented by the following general formula $$R^2\underset{R^1}{\overset{R^1}{\underset{|}{\overset{|}{Si}}}}M$$

in which R¹, R², and M are defined as above or (B') disiloxane as represented by the following general formula $$(R^2-\underset{R^1}{\overset{R^1}{\underset{|}{\overset{|}{Si}}}})_2-O,$$

and (C) hydrolyzable silane as represented by the following general formula

SiM₄

M in the formula is defined as above.

* * * * *